United States Patent [19]

Chattler

[11] Patent Number: 4,634,964
[45] Date of Patent: Jan. 6, 1987

[54] INSTRUMENTS AND SYSTEMS FOR MEASURING CABLE CAPACITANCES

[75] Inventor: Leo M. Chattler, San Leandro, Calif.

[73] Assignee: DCM Industries, Inc., San Leandro, Calif.

[21] Appl. No.: 635,662

[22] Filed: Jul. 30, 1984

[51] Int. Cl.[4] .................. G01R 11/52; G01R 27/26
[52] U.S. Cl. .......................................... 324/60 C; 379/6
[58] Field of Search ............. 324/60 C, 60 R, 60 CD; 179/175.3 R, 79

[56] References Cited

U.S. PATENT DOCUMENTS

| | | | |
|---|---|---|---|
| 3,159,786 | 12/1964 | Bayne | 324/60 R |
| 3,663,955 | 5/1972 | Shimizu | 324/60 R |
| 3,761,805 | 9/1973 | Dornberger | 324/60 C |
| 4,103,225 | 7/1978 | Stephens | 324/60 CD |
| 4,394,616 | 7/1983 | Browne et al. | 324/60 C |

FOREIGN PATENT DOCUMENTS 0144964 11/1980 German Democratic Rep. ... 324/60 C
0924592 4/1982 U.S.S.R. .......................... 324/60 R

OTHER PUBLICATIONS

Squarzini, Jr., Capacitance Tester, IBM Technical Disclosure Bulletin, Mar. 1983, p. 32.

*Primary Examiner*—Stanley T. Krawczewicz
*Attorney, Agent, or Firm*—Robert B. Chickering; Glen R. Grunewald

[57] ABSTRACT

A system for measuring the capacitance of an electric signal conductor, with particular interest on telephone cables. A waveform generator produces a test signal which is coupled to the conductor. The resultant signal emerging from the conductor is delivered to a receiver, and then to an integrator, to produce an output signal which is a direct digital measure of the conductor's capacitance.

27 Claims, 2 Drawing Figures

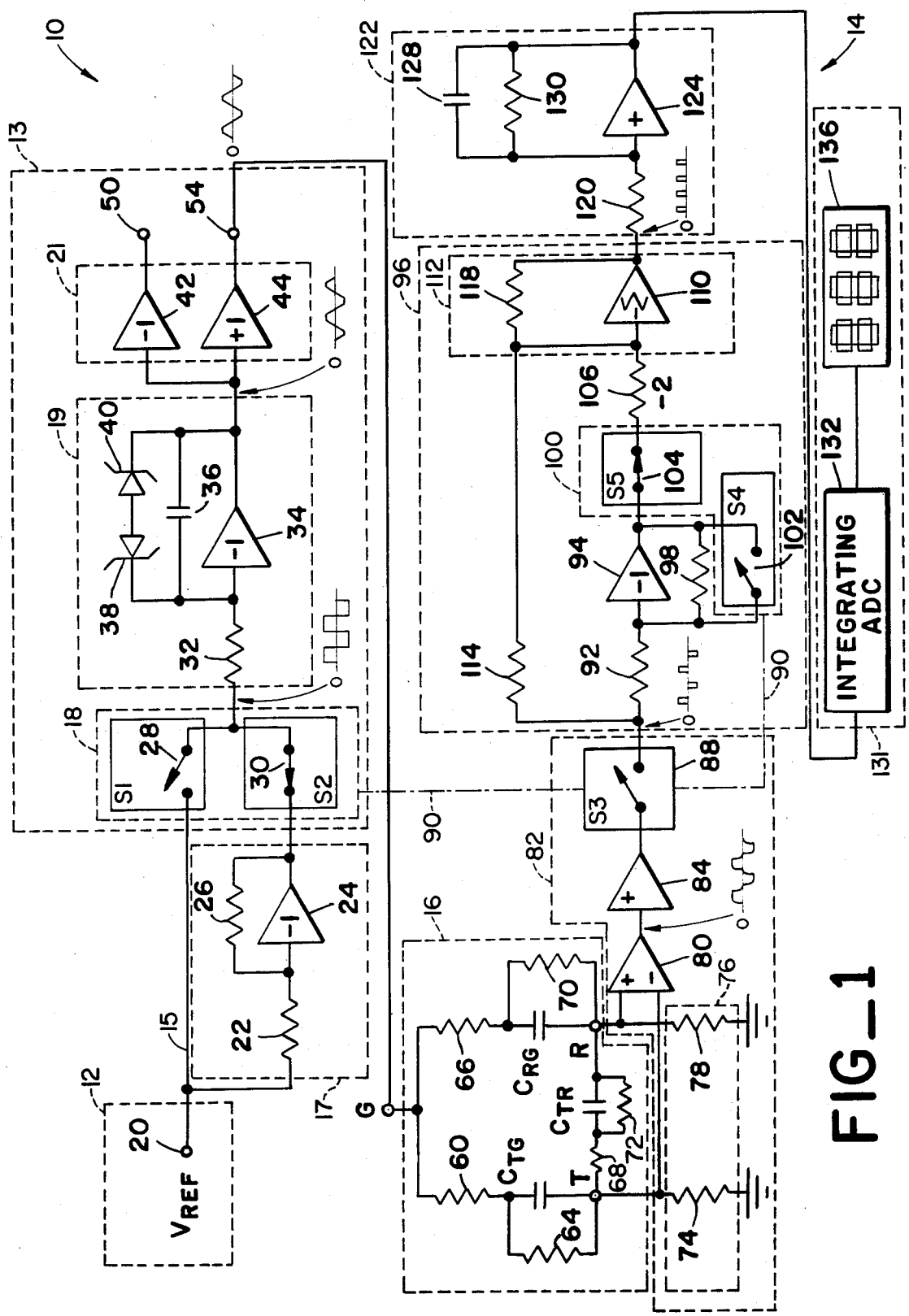
FIG_1

FIG_2
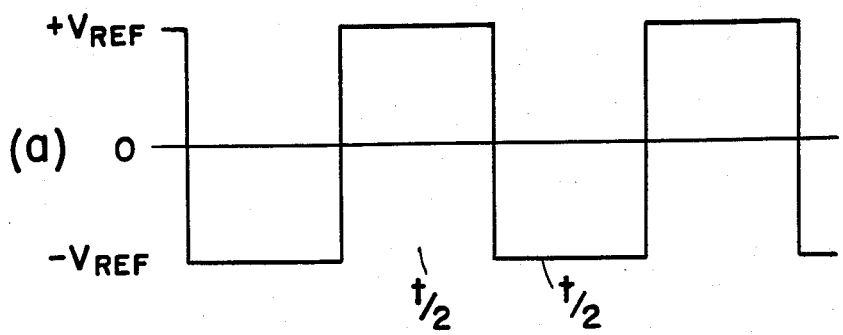
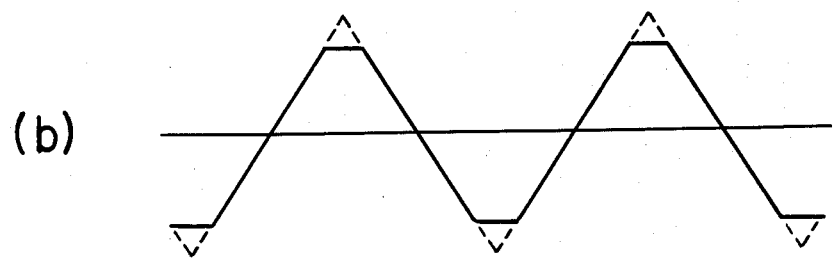
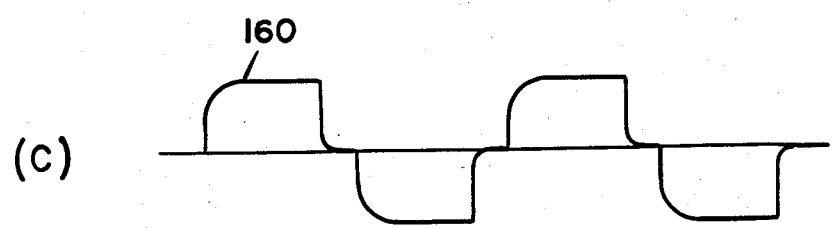
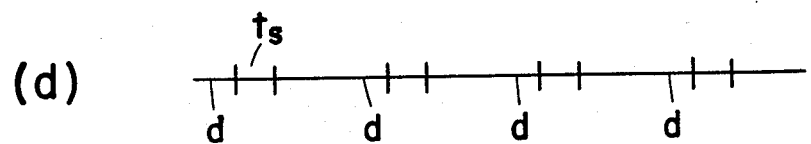
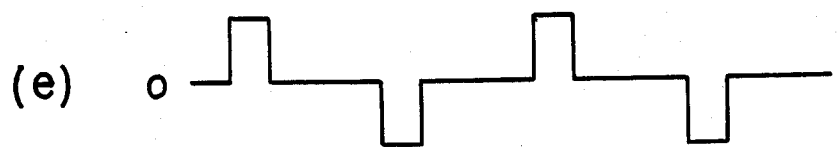

INSTRUMENTS AND SYSTEMS FOR MEASURING CABLE CAPACITANCES

BACKGROUND

This invention relates generally to test, measurement instruments, and systems for characterizing multipair telecommunications circuits where twisted pairs of insulated conductors are stranded together to form the core of a communications cable.

Due to the proximity of the conductors to each other, the composition of materials used to insulate the conductors, and the composition of materials used to insulate and shield the cable core, various forms of capacitance appear normally between the conductors of a twisted pair and other elements of the cable. These capacitances typically occur in the four forms of: (1) capacitance—mutual (CM) between the two wires of the twisted pair; (2) capacitance—unbalance-pair-to-ground (CUPG); (3) capacitance—unbalance-pair-to-shield (CUPS); and (4) capacitance—unbalance-pair-to-pair (CUPP).

These capacitances must be controlled to achieve high fidelity communication with minimum noise. Signal degredation is associated with each capacitance, as follows. The mutual capacitance (CM) attenuates the voice signal, and therefore affects the ability to hear on a telephone line. The capacitance unbalance of a twisted pair to ground (CUPG), and the capacitance unbalance to shield (CUPS), must be controlled in order to prevent crackling noises from appearing on the telephone circuits due to power line harmonic induction. The capacitance unbalance pair to pair (CUPP) must be controlled in order to prevent crosstalk between telephone circuits in the voice frequency band of 200 to 3000 Hz.

Existing measurement systems have been designed for use in the cable factory, not for installed telephone cables and plants in the field. These systems are too large and cumbersome and are, therefore, very different if not impossible to transport. Conventional systems for measuring telephone cable CM, CUPG, CUPS, and CUPP include a sinusoidal excitation approach known as the Bridge Technique, and the Constant Current Charging RC Technique.

The Bridge Technique can only measure short lengths of cable, and therefore is not suitable for long lengths in the outside plant. In addition, when the instrument is coupled to the cable under test, knobs must be adjusted to balance the cable capacitance against a standard capacitator; this requires comparison of unlike quantities because the capacitor is a lumped capacitance, while the cable is a distributed capacitance. Accordingly, this technique is cumbersome, time consuming, and offers ample opportunity for human error. Many switching functions are required, thus making for an instrument which wears out and is less rugged than desired. In addition, this technique is subject to phase shift and signal delay which is inherent in transmission lines and cables; this results in erroneous readings, especially in "lossey" dielectrics.

The Constant Current RC Charging Technique has the disadvantage of pulsing a large initial transient signal for inductive loads. Also, it has the disadvantage of requiring that the load be coupled to the system being measured as part of the feedback path. This approach lacks predictable frequency spectrum response, and is subject to power line and radio frequency (RF) noise.

Additionally, the capacitance measurement is affected by the individual presence of series resistance and/or parallel resistance which produces a shunt conductance; the simultaneous presence of both types of resistances has a second-order effect also in lossey dielectrics; erroneous readings will be obtained.

In practically all conventional cases where capacitance measurement circuits are described for measuring these capacitances, it is recommended that distributed capacitance circuits be added; however, this has been difficult to achieve. For example, in the pair to ground case, previous techniques must reference ground and therefore provide unstable readings.

SUMMARY OF THE INVENTION

This invention provides a system for measuring the capacitance of electric signal conductors, particularly telephone cables.

The system includes a waveform generator, for generating a variable test signal which is coupled to the conductor. A receiver is connected to the conductor, for receiving a variable resultant signal produced in the conductor in response to the varying test siqnal. The receiver transmits the resultant signal to an integrator, for integrating the variable resultant siqnal to produce an output signal which is a measure of the conductor's capacitance.

Additional features and embodiments of the invention include: a power source coupled in part through a power invert stage to a waveform generator; a waveform generator including an alternating switch network coupled through an inverting amplifier (amp) stage to a buffer amplifier; a sensing, amplifying and gating network including parallel sensing resistors, a differential amplifier, and a gating switch; a synchronous rectifier amplifier having an internal amp controlled by two cooperating switches, the output of which is fed to an inverting summing stage; and a low pass filter which connects the synchronous rectifier to a display circuit having an integrating ADC and a digital display panel.

BRIEF DESCRIPTION OF THE DRAWINGS

FIG. 1 is a composite schematic and circuit block diagram showing an embodiment of the invention; and, FIG. 2 is a signal timing diagram generated by the operation of the FIG. 1 embodiment of the invention.

DETAILED DESCRIPTION OF A SPECIFIC EMBODIMENT

Described below is that which the inventor considers at present to be the best mode of fabrication, assembly and operation for carrying out the invention. This is a necessarily narrow specific example of one of many possible ways to practice the claimed invention.

The invention itself is much broader in scope, and is defined by the Claims.

Detailed Description: Overview

Broadly stated, the functional elements of this embodiment include a power source 12 coupled to a waveform generator 13, which developes a test signal for delivery to a circuit or cable under test 16. In response to the test signal, cable 16 develops a resultant signal which is delivered through circuits to a synchronous rectifier amplifier 96, where the result or response signal is integrated, inverted, and summed.

Amp 96 output signal flows through a low pass filter 122, and on to a display circuit 131 where the capacitance of cable 16 is shown on a digital display 136.

More particularly stated, power source 12 is coupled through a line 15, and a power invert stage 17 which is parallel to line 15, to an alternating switch network 18 within wave form generator 13. Line 15 is coupled to a switch S1, designated with reference numeral 28, which is contained within network 18. Likewise, power invert stage 17 is coupled to a switch S2, designated with reference numeral 30, contained within switch network 18.

Waveform generator 13, in addition to alternating switch network 18, includes an inverting amp stage 19 connected to receive a signal from network 18. Also included within waveform generator 13 is a buffer amplifier 21, connected to receive a signal from inverting amp stage 19.

Inverting amp stage 19 includes a resistor 32, which is coupled to the inverting (negative) input of an amplifier 34. Coupled in parallel with amp 34 is a capacitor 36, and a reverse zener diode pair 38, 40. Buffer amp 21 includes an amp 42 and an amp 44. From amp stage 19, the output of amp 34 is delivered to the inverting input of amp 42, and the non-inverting (positive) input of amp 44. The output of respective amps 42 and 44 are coupled to a pair of terminals 50 and 54.

The ouput of waveform generator 13 is coupled from terminal 54 to a terminal G of cable 16 under test. The capacitance inherent to cable 16 is represented by three capacitance branches, which are connected in series to terminal G. First capacitance branch includes a resistor 60, connected in series to a capacitor CTG to a terminal T; a resistor 64 is connected in parallel across capacitor CTG to terminal T.

Likewise configured is a second capacitance branch, which includes a resistor 66 connected in series across a capacitor CRG to a terminal R; a resistor 70 is connected in parallel across capacitor CRG to terminal R. A third capacitance branch is coupled between terminals T and R. This third branch includes a resistor 68 connected in series across a capacitor CTR to terminal R; a resistor 72 is connected in parallel across capacitor CTR to terminal R.

A sensing resistor network 76 is coupled to terminals T and R, to receive the output signal from cable 16. The test signal entering through terminal G produces within cable 16 a resultant signal which leaves cable 16 through terminals T and R. Within sensing resistor network 76, a resistor 74 is coupled between terminal T and ground. Likewise, a resistor 78 is coupled between terminal R and ground. Network 76 functions as a signal detector.

A signal detected by resistor 74 is delivered to the inverting input of a downstream differential amp 80. Likewise, the signal detected by resistor 78 is delivered to the non-inverting input of amp 80. The output from amp 80 is delivered to the non-inverting input of an adjustable gain amplifier 84. The output of amp 84 is coupled to a third switch S3, designated by reference numeral 88, which is a gating and sampling switch.

Switch 88 is connected through a coupling line (dashed) 90 to switches 28 (S1) and 30 (S2), as well as to switches S4 (102) and S5 (104), discussed below. These five switches are interconnected to operate synchronously, so they are correctly timed to work on the various signals as signals progress through the overall system.

Synchronous rectifier amp 96 is connected to switch 88. Rectifier 96 includes a resistor 92 coupled to the inverting input of an amp 94. A resistor 98 is coupled in parallel with a switch 102 across the inverting input and the output of amp 94. The output of amp 94 is connected through a fifth switch S5 (reference numeral 104) and a resistor 106 to the inverting input of a summing amplifier 110. A resistor 118 is coupled across the output and the inverting input of amp 110, together to form an inverting summing stage 112.

Returning to switch 88, its output is also delivered to a resistor 114 connected in parallel with resistor 92 to the inverting input of amp 110.

The output of synchronous recitifier 96 is delivered to a low pass filter 122 through a resistor 120. Resistor 120 is connected to the non-inverting input of an amp 124. A capacitor 128 and a resistor 130 are coupled in parallel across the output and non-inverting input of amp 124.

The output of low pass filter 122 is delivered to an integrating (analog-to-digital converter) 132 of display circuit 131. From here, the signal is delivered to a digital display 136, for visual display of the capacitance of cable 16.

Detailed Description: Specific Systems

System 10

Referring to FIG. 1, the cable measurement system 10 includes a power source 12 for providing a constant current, as well as detection and display circuitry 14. The circuit cable under test 16 is connected between source 12 and detection circuit 14 by conventional means. Source 12 and detection circuit 14 are contained within a ruggedized instrument case (not shown) having electrical terminals for coupling the instrument to the cable.

Cable 16 under test possesses plural inherent electrical properties. Of particular interest is capacitance. By appropriate connection, cable 16 exhibits the following capacitance parameters to the measurement system 14: (1) mutual capacitance, Cm, a measure of the transmission efficiency of telephone cables expressed in nanofarads per mile, nF/mile; (2) capacitance unbalanced to ground (earth), Cupg, and (3) to shield (external earth), Cups, of the conductor, a measure of the susceptibility to noise pick-up during transmission; and (4) capacitance unbalance pair to pair, Cupp, expressed in picofarads per 1,000 feet, pF/1,000 ft, an indication of the susceptibility to voice frequency cross talk in communication.

Capacitance unbalance to ground is expressed in picofarads per 1,000 feet, pF/1,000 ft. Proper control of the capacitance unbalance to ground characteristics reduces powerline harmonics, the major cause of noise on the transmission line. In FIG. 1, the Cupg equivalent circuit is shown. However, by transposing and connecting the appropriate cable leads to the instrument system 10, the other cable capacitance parameters may be similarly determined.

Source 12 includes a voltage reference, Vref, 20. Vref is connected through a resistor 22 to the input of an operational amplifier (op amp) 24. Resistor 22 provides input resistance for amplifier (amp) 24; a resistor 26 functions as a conventional feedback resistor. Resistors 22 and 26 are connected to the (negative) inverting input of operational amplifier 24; resistor 26 has its opposite end connected to the output of amplifier 24.

Resistors 22 and 26 are selected in the conventional manner so the ratio of the two resistors determines the gain of the amplifier 24. Also, amp 24 is selected so that, in conjunction with resistors 22 and 26, a unity gain stage is provided. A suitable amp 24 is the LM741 manufactured by National Semiconductor Co. of California.

Waveform Generator 12

The output of amplifier 24 and Vref are applied respectively as inputs to two alternate switches 28 and 30. Switches 28 and 30 open and close alternately, to supply a square wave output, as shown in FIG. 2(a), which is connected to the input of resistor 32. Switches 28 and 30 can have equal off and on times to provide a square wave output having amplitudes of +Vref and −Vref.

Switches 28 and 30 are driven by either internal or external timing circuitry (not shown) having a selected period T such as 1.25 milliseconds, or a selected frequency such as 800 hertz. A control means (not shown) is used to select the desired frequency. Further, as will be seen, switches 28 and 30 operate in a synchronized fashion in step with integrating and rectifying switches disclosed below. Switches 28 and 30, although shown schematically as simple devices, can in practice be implemented in the form of TTL (transistor-transistor-logic) digital switches or corresponding analog integrated circuits employed to function in a similar way.

A resistor 32 serves as the input resistor for an operational amplifier 34, and is connected to the inverting input of the amplifier. Operational amplifier 34 provides unity gain and an integration function. The integration function is determined by the feedback capacitor 36 connected between the input and output of the amplifier.

The time constant of this integration block is selected to have a sufficient duration so that it functions most of the time as an integrator. The integrator provides a linear ramp function when driven by the square wave output of switches 28 and 30. At the same time, the time constant is selected to be short enough such that the output is driven from one voltage Vref to the other over each half cycle (i.e., half period), T/2.

Bipolar voltage limiting devices, 38 and 40, are connected across capacitor 36. Operational amplifier 34 thus provides, for a constant voltage input, an integral output which is a linear slope or ramp opposite in polarity to the incoming signal. Devices 38 and 40 further symmetrically clip the output to produce a truncated triangle output signal as shown in FIG. 2(b).

The output of amplifier 34 is connected to both (1) the inverting input of a buffer amplifier 42, and (2) the noninverting (positive) input of an amp 44. Amplifier 42 can be adjusted to provide unity gain and an output at a terminal 50. Similarly, the output of amplifier 34 is connected to the noninverting (positive) input of amplifier 44, which also has unity gain and is connected to an output terminal 54.

For most capacitance measurements, only a single output at terminal 54 will be utilized. However, for an important subclass of unbalance measurements Cupp, two outputs are required. Terminals 50 and 54 thus provide the respective inverting and noninverting outputs for these measurements.

Circuit Under Test 16

For the basic capacitance unbalance measurement, circuit or cable 16 has a terminal G connected to output terminal 54. Cable 16 has three equivalent circuits coupled to three terminals G, T, and R, corresponding to ground, tip, and ring in the operational environment. Between any two of these terminals there exists the capacitances CTR, CRG, and CTG. In the configuration shown, the capacitance unbalance CTG-CRG is to be measured.

Additionally, an equivalent series resistance 60 is connected from terminal G across CTG to terminal T. Across capacitance CTG there exists a parallel conductance provided by a resistor 64. Similarly, a series resistance 66 is connected from terminal G across CRG to terminal R. A parallel conductance is provided by a resistor 70 which is connected across CRG. In a manner like CTG and CRG, CTR is connected between terminals T and R with a series resistor 68, as well as a parallel resistor 72 to provide a conductance, to form a network across CTR.

Sense, Amplify and Gate Network 82

A first series resistor 74 is connected between terminal T and ground, and a second series resistor 78 is connected between terminal R and ground. Terminal T is connected to the inverting input of operational amplifier 80. Terminal R is connected to the noninverting input of amplifier 80.

Operational amplifier 80 performs a differential function. and provides an output signal shown FIG. 2(c). This signal is connected to the input of a ranging and normalizing adjustable gain amplifier 84. The output of amplifier 84 is connected to the input of an integrating amplifier 88. Through a coupling line (dashed) 90, gate 88 is coupled to and synchronized with switches 28 and 30 to provide gate 88 closure after a fixed predetermined delay from the start of the ramp generated by switches 28 and 30.

Synchronous Rectifier Amplifier 96

The output signal (see FIG. 2(e)) of switch 88 is connected through an input resistor 92 to the inverting input of an operational amplifier 94. A feedback resistor 98 is connected between the input and output of amplifier 94 to provide overall unity gain. Also included is an adjustable switching network having a switch 102 and a switch 104. Switch 102 is (1) connected across feedback resistor 98, (2) coupled through coupling line 88 to the ramp switches 28 and 30, and (3) connected to a switch 104 which is synchronized to alternate with switch 102. Switches 88, 102 and 104 can be configured using commercially available digital integrated circuits.

Switch 104 has an input connected to the output of amplifier 94, as well as an output connected across an input resistor 106 to the inverting input of a summing amplifier 110. Also connected to the output of gate 88 is a summing resistor 114, which is connected to the inverting input of amplifier 110. A feedback resistor 118 is connected between the input and output of amplifier 110.

Amplifiers 94 and 110, together with the associated switches and resistors, comprise a synchronous rectifier amplifier with programmable polarity. Resistors 106 and 114 are selected to provide summing weights at the input of amplifier 110, such that the input from resistor 106 has twice (as indicated by the −2) the summing weight as the input from resistor 114.

The output of summing amplifier 110, having the signal waveform shown in FIG. 2(f), is connected to an input resistor 120, which has its opposite end connected to the noninverting input of an amplifier 124. Amplifier 124 is used to provide a low pass filter, or averaging, function, utilizing (1) a capacitor 128 connected from the input to output of the amplifier, and (2) a feedback resistor 130 similarly connected thereacross.

Display Circuit 131

The output of amplifier 124 is connected to the input of integrating ADC (analog-to-digital converter) 132. ADC 132 is a commercially available integrated circuit. The output of ADC 132 is connected to the input of a digital display 136. Display 136 can be a conventional display module capable of being driven by ADC 132.

Detailed Description: Operation

Switches 28 and 30 are caused to alternately operate with a period of t (also designated as T). The input to amplifier 34 is a square wave (FIG. 2(a)). Operational amplifier 34 functions as an integrator when driven by the square wave input, to produce the truncated triangle waveform of FIG. 2(b) as an output from waveform generator 12.

This symmetrically clipped triangular waveform is applied to the G terminal of cable 16. Applying the constant current waveform causes the current to flow through the three series paths of (1) resistor 60, capacitor CTG, and resistor 74, (2) resistor 66, capacitor CRG, and resistor 78, (3) resistor 68, capacitor CTR, and resistor 74 or 78. Current through the parallel resistors 64 70, and 72 provide parallel conductance, which depends on the voltages across the respective capacitances.

Under steady state conditions, a constant current will flow through each of the respective capacitance branches (i.e., (1) the branch including 60, CTG, and 64, (2) the branch including 66, CRG, and 70, and (3) the branch including 68, CTR, and 72) when the voltage ramp is applied. The magnitude of the current is directly proportional to (1) the value of the capacitor, and (12) the slew rate of the ramp.

When sensing resistors 74 and 78 are placed in series with the respective capacitance branches, resistors 74 and 78 will have constant currents flowing through them, to thereby provide a constant voltage drop resulting from the current. Although the voltage drop across resistors 74 and 78 will be subtracted from that across capacitors CTG and CRG, the slope of the voltage curve is unaffected, and thus the current through capacitors CTG and CRG remain the same.

Further, under steady state conditions, the voltage across the respective sensing resistors 74 and 78 is proportional to the current through the respective capacitor branches, and thus the capacitance values in each branch. By measuring the voltage across sensing resistors 74 and 78 at the differential inputs of amplifier 80, the value of the capacitance unbalance between the two branches is obtained. A represenative output waveform of differential amplifier 80 is shown in FIG. 2(c).

Amplifier 84 provides further amplification of the differential signal. Amp 84 is also adjustable (1) to permit measuring different signal phase angles, (2) for hardware normalization to various cable lengths, and (3) for calibration to a known capacitance standard.

Other circuit and cable characteristics have been found to have negligible effect on the capacitance measurement. Series resistors 60 and 66, like sensing resistors 74 and 78, do not affect the slope of the waveform. Thus, the current through the respective capacitors CTG and CRG remains the same.

The parallel resistors 64, 70, and 72 can have a deleterious effect on the capacitance measurement if care is not taken to compensate for the resistors' effect. Some current which flows through the capacitor in each branch may be diverted through the respective parallel resistors. Hence, the current through each branch will be proportional to the voltage across the respective resistor as well as across the capacitance. This provides a total current which will then have an AC as well as a DC component.

The AC ramp component can be compensated for by (1) operating the integration sample gate 88 when the voltage across the capacitor under test is zero, or (2) averaging samples symmetrically around zero. When the voltage across the capacitor is zero, the shunt conductance through a parallel resistor 64, 70, or 72 will not contribute to the overall measurement.

Gate 88 provides means for sampling the waveform symmetrically about zero (see FIG. 2(d)). Gate 88 is triggered to operate each half cycle after a delay "d" from initiation of the ramp, for a fixed period "ts", at a time when the ramp is passing through zero or averaged about zero. During calibration of the instrument using system 10, the delay is adjusted to provide a zero output with the instrument connected to a representative conductance. Over a full cycle, this adjustment provides a sample which is symmetrical about zero volts.

Integration gate 88 also compensates for the effects of a non-steady state waveform. Although the driving test waveform is piecewise-linear, the steady state analysis breaks down at the discontinuities in the slope of the waveform. The current through an ideal capacitance which is excited by a trapezoidial waveform will approximate a bipolar pulse train. The magnitude of the current is proportional to the slope of the voltage waveform.

When the cable series resistances 60 and 66 and the current sensing resistors 74 and 78 are added, the leading edges of the pulse train round off as at portion 160 in FIG. 2(c). Also, the current through the test capacitor CTG, CRG or CTR then approaches its steady state value exponentially. The time it takes to approach this steady state value is proportional to the product of the total series resistance multiplied by the test capacitor.

To keep the rounded corners portions 160 from affecting the capacitance measurement, the data sample is not taken until the current has approached its steady state value. A sample time delay is used to avoid portions 160. This sample time delay constraint limits the width of the sample that can be taken by gate 80. If the pulse sampled is too wide, the portion of the rounded corner 160 may be included, and thus cause an error in measurement. This time delay factor can be minimized by using the small current sensing resistors 74 and 78, having values on the order of 100 ohms.

Using small current sensing resistors 74 and 78 also reduces the effect of direct coupling capacitor CTR between the T and R terminals. Sensing resistors 74 and 78 minimize the potential difference that can exist between terminals T and R, and in turn reduce the current that would otherwise flow between T and R to disturb the measurement. In practice, CTR is generally about one half the size of either CTG or CRG. Further, the voltage across CTR is three or four orders of magnitude less than the voltage across CTG or CRG. These two factors make the effect of CTR negligible, so CTR is ignored.

A further reason for minimizing the size of sensing resistors 74 and 78 concerns the shunt conductances resulting from parallel resistors 64 and 70. Although either the series resistors 60 and 66 or the shunt resistors 64 and 70 alone will not affect the capacitance reading, they will slightly reduce the capacitance reading when both series and shunt resistors are simultaneously present. Their combination acts like a resistance divider that reduces the effective voltage across the capacitor under test. The amount the voltage is reduced is expresssed as Rs/(Rp+Rs), where Rs is the total series resistance and Rp is the inverse of the parallel resistor conductance. In most cases, the parallel conductance is such a low value that this effect is negligible and can be ignored.

Gate 88 provides a bipolar output signal shown in FIG. 2(e). Over one half cycle the output is positive; over the next half cycle the output is equal but negative. Averaging the results of the two half cycles produces a result which is zero.

Amplifiers 94 and 110, as mentioned, are part of synchronous rectifier amp 96. Switches 102, 104 and 88 are coupled to source switches 28 and 30 to thereby provide switching which is synchronous with the excitation signal. When rectifier 96 operates in an inverting mode, switch 102 is closed and 104 is open. This combination shuts down the output of amplifier 94 and disconnects it from the summing amplifier 110. Amplifier 110 then acts as an ordinary inverting amplifier, receiving its input directly from gate 88.

When switches 28 and 30 switch to the alternate position, synchronous rectifier 96 operates in a noninverting mode, with switch 102 open and switch 104 closed. This combination allows amplifier 94 to operate as a unity gain inverter which has its output connected to the inverting summing amplifier 110.

Resistor 106 provides twice the summing weight to amp 110 from amplifier 94 as the summing weight from the other summing path via resistor 114. The effect from the output of amplifier 94 is thereby doubled in the summation process. Amplifier 94 inverts the output from gate 88; thus, the summing input from gate 88 through resistor 114 cancels out the output from amplifier 94 at the input terminal of summing amplifier 110. The result obtained is the same as if the input from gate 88 had been switched out completely, and the signal from amplifier 94 were only single weighted. As the signal passes first through inverting amplifier 94 and then through inverting summing amplifier 110, a double inversion is produced, resulting in the noninverted waveform output as shown in FIG. 2(f).

From amp 110, the signal passes through amplifier 124 which is configured as a low pass filter. The peaks of the signal leaving amp 110 are sometimes so high that they saturate ADC 132. Low pass filter 122 reduces the peaks of the waveform to a value that the ADC can handle without changing the average value of the waveform. The resulting waveform is similar to FIG. 2(f) but with reduced peak values. Alternatively, the separate low pass filter 122 may not be necessary, provided that the same smoothing function is incorporated into the summing amplifier 110.

Integrating ADC 132 integrates the signal from amp 124 over a predetermined period of time sufficient to provide a display. Integration over time in the ADC 132 improves the system resistance to noise. To provide highest accuracy and stability in output, noise disturbances are preferably periodic so the number of disturbance periods fit within the integrating interval of the ADC. In the present invention, the integrating interval has been chosen so that the signal ripple from the amp 124 and the 50 or 60 Hertz powerline noise will be nulled. The output signal from ADC 132 provides electrical signals to operate digital display 136.

In conclusion, the above invention provides a system for measuring capacitance in telephone cables by using a novel voltage ramp charging technique. This inventive system is faster and simpler to use than the conventional bridge technique. There is no need to adjust knobs to balance a bridge, nor is there a need to interpret the output of the null detector of the type found in bridge testing circuits. The invention is more rugged than the bridge, because very little switching is involved, and there is no need for a fragile null detector. This invention is immune to the phase shift and signal delay problems inherent with transmission lines such as telephone cables.

Other advantages include the ability to only use a small initial transient signal for loads. The guarding is straightforward; the load is not in the feedback path. The invention provides a well defined, predictably frequency spectrum. The value of capacitance is read out directly as a digital number expressed in farads. The system has inherent immunity to power line noise and radio frequency noise. This inventive voltage ramp measurement technique is unaffected by individual presence of series resistors, and/or parallel resistors for shunt conductance.

Claims Define Invention

While the above best mode provides a full and complete disclosure of a specific preferred embodiment or embodiments of the invention, it is noted that various modifications, alternate constructions, and equivalents may be employed without departing from the true spirit and scope of the invention. Therefore, the above description and illustrations shall not be construed as limiting the invention.

The scope of the invention is defined by the breadth of the appended Claims.

What is claimed is:

1. A system for measuring capacitance in an electric signal conductor cable, the system comprising;
  (a) signal generating means for generating a regularly varying test signal;
  (b) connecting means for coupling one end of a conductor in a cable in which capacitance is to be measured to the signal generating means;
  (c) sensing means for connection to the other end of the cable in which capacitance is to be measured, the sensing means being operable to sense the magnitude of each of the signals which pass from the cable in response to said test signals; and
  (d) means for integrating the response signals, to produce output signals which measure capacitance in the cable.

2. The system of claim 1, further including:
  (a) a power source, for supplying a power signal having a constant current and a voltage ramp characteristic;
  (b) means for inverting a selected portion of the power signal, to thereby produce an inverted power signal; and
  (c) means for switching, including a first switch and a second switch, coupled to alternately receive the power signal and the inverted power signal.

3. The system of claim 1, wherein the means for generating a variable test signal further includes a waveform generator, comprising:
  (a) an alternating switch network, for receiving power signals from the power source and generating a switch signal;

(b) means for inverting and amplifying the switch signal, for receiving the switch signal and generating an inverted amplified signal; and (c) a buffer amplifier, selectively operable to invert the inverted amplified signal, for receiving the inverted amplified signal and for producing as an output a variable test signal.

4. The system of claim 1, wherein the electric signal conductor is a telephone cable.

5. The system of claim 1, wherein the means for receiving further includes:

(a) a sensing network, including a first resistor for receiving a first resultant signal from the conductor, and a second resistor for receiving a second resultant signal from the conductor; and (b) a differential amplifier, connected to receive and differentially amplify the resultant signals after they pass through the first and second resistors, to produce a differential output signal.

6. The system of claim 5, further including:

(a) a ranging and normalization amplifier, for receiving the differential output signal and generating a normalized signal; and (b) a third switch, serving as an integrating gate switch for generating a gated signal.

7. The system of claim 1, wherein the means for integrating comprises:

(a) a synchronous rectifier amplifier; and (b) a low pass filter, connected to receive the signal from the synchronous rectifier amplifier.

8. The system of claim 7, wherein the synchronous rectifier amplifier comprises:

(a) a unity gain amplifier;

(b) a fourth switch, connected in parallel between the output and inverting input of the unity gain amplifier;

(c) a fifth switch, connected to the output of the unity gain amplifier, synchronized to operate in cooperation with the fourth switch;

(d) a rectifier resistor branch, coupled in parallel with the unity gain amplifier and fifth switch; and (e) an inverting summing amplifier, for receiving the signals from the fifth switch and the rectifier resistor branch.

9. The system of claim 8, wherein the synchronous rectifier amplifier is coupled through a low pass filter to a digital display circuit.

10. The system of claim 1, further including a plurality of switches, inter-connected to operate synchronously to insure that the signals moving through the system are properly timed.

11. A system for directly measuring the capacitance in a cable, comprising:

(a) a power source;

(b) a waveform generator, coupled to the power source, for generating regularly varying test signals which are delivered to the cable;

(c) means for sensing, amplifying and gating resultant signals received from the cable in response to said test signals;

(d) a synchronous rectifier amplifier, for receiving the signal from the sensing, amplifying and gating means, and producing an inverted summed signal as an output; and (e) means for displaying the inverted summed signal, for providing a direct indication of capacitance.

12. The system of claim 11, further including a plurality of interconnected synchronized switches, comprising;

(a) a first and a second switch, connected to each other to operate alternately, forming a part of the waveform generator for receiving the power signal;

(b) a third switch, forming a part of the sensing, amplifying and gating means, for receiving the resultant signal; and (c) a fourth and a fifth switch, connected to each other to operate alternately, forming a part of the synchronous rectifier amplifier, for operating on the signal received from the sensing, amplifying and gating means.

13. The system of claim 11, wherein the power source can deliver a power signal having a constant current and a voltage ramp characteristic.

14. The system of claim 11, wherein the waveform generator comprises:

(a) an alternating switch network, having a first and a second switch which are connected to cooperate;

(b) an inverting amplifier stage, coupled to the alternating switch network; and (c) a buffer amplifier stage, coupled to the inverting amplifier stage, to output the test signal.

15. The system of claim 11, wherein the sensing, amplifying and gating means comprises:

(a) a first resistor, for receiving a first resultant signal from the cable;

(b) a second resistor, for receiving a second resultant signal from the cable;

(c) a differential amplifier, coupled to receive the resultant signals after they are received by the first and second resistors; and (d) a switch, for gating the output signal of the differential amplifier to the synchronous rectifier amplifier.

16. The system of claim 11, wherein the synchronous rectifier amplifier comprises;

(a) an amplifier, for receiving the signal from the sensing, amplifying and gating means;

(b) a first switch, coupled in parallel between the output and the inverting input of the amplifier;

(c) a second switch, coupled to the output of the amplifier, connected to cooperate with the fourth switch;

(d) a parallel resistor branch, coupled between the output of the amplifier and output of the fifth switch; and (e) an inverting summing stage, for receiving the signals from the parallel resistor branch and the amplifier.

17. The system of claim 11, wherein the means for displaying is a visual digital display.

18. A system for measuring the capacitance of an electric circuit under test, the system comprising:

(a) a signal source, for generating a test signal having a first polarity for a first interval and a second polarity for a second interval, the scource being connected to deliver the test signal to the test circuit;

(b) means for sensing, connected to the test circuit, for receiving the resultant signal produced in the test circuit by the test signal, the resultant having polarities and intervals corresponding to those of the test signal;

(c) means for integrating, responsive to the resultant signal intervals, connected to the detecting means, for determining the capacitance of the test circuit corresponding to the resultant signal; and (d) means for displaying, connected to the integrating means, to visually display the capacitance of the test circuit.

19. The system of claim 18, wherein the electric circuit under test and the sensing means are connected for differentially determining the resultant signal from at least two circuit test signal paths.

20. The system of claim 18, further including a display means which is coupled through an integrating means to a synchronous rectifier which is responsive to the resultant signal intervals.

21. The system of claim 20, further including an averager which is connected between the rectifier and display means.

22. The system of claim 21, further including a ranging and normalizing amplifier which is interposed between the sensing means and the integrating means.

23. The system of claim 22, wherein the display means further includes an integrating analog-to-digital converter coupled to a digital display for visual output.

24. The system of claim 22, further including respective first and second resistors, one in each of the test circuit signal output paths, connected to provide the detecting means with a differential current signal which is a function of the charging signal through the respective resistors.

25. The system of claim 24, wherein the resistors have resistance values substantially less than the inherent series resistance of the test circuit being measured.

26. A method for measuring the capacitance of a cable of the type having an input and a plurality of outputs, comprising the steps of:

(a) applying a variable test signal as an input to the cable, the test signal having a first polarity for a first interval and a second polarity for a second interval, to produce a variable resultant signal as an output;

(b) differentially detecting the resultant output signals of the cable, to provide a differential signal;

(c) integrating the differential signal for at least a portion of each source interval; and (d) rectifying the integrated signal synchronously with each test signal interval to generate a value of the cable's capacitance.

27. The method of claim 26, further comprising the step of averaging the output of the rectifying step before displaying a signal.

* * * * *